(12) United States Patent
McQuirk et al.

(10) Patent No.: US 9,306,543 B2
(45) Date of Patent: Apr. 5, 2016

(54) TEMPERATURE-COMPENSATED HIGH ACCURACY CLOCK

(71) Applicant: FREESCALE SEMICONDUCTOR, INC., Austin, TX (US)

(72) Inventors: Dale J. McQuirk, Austin, TX (US); Michael T. Berens, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 159 days.

(21) Appl. No.: 14/149,219

(22) Filed: Jan. 7, 2014

(65) Prior Publication Data

US 2015/0194949 A1   Jul. 9, 2015

(51) Int. Cl.
*H03K 3/011*   (2006.01)
*H03M 1/70*   (2006.01)
*H03K 5/00*   (2006.01)

(52) U.S. Cl.
CPC ............ *H03K 3/011* (2013.01); *H03K 5/00006* (2013.01); *H03M 1/70* (2013.01)

(58) Field of Classification Search
CPC .................................. H03K 3/02; H03K 3/023
See application file for complete search history.

(56) References Cited

U.S. PATENT DOCUMENTS

| | | | |
|---|---|---|---|
| 5,180,995 A | | 1/1993 | Hayashi et al. |
| 5,748,048 A | * | 5/1998 | Moyal .............................. 331/34 |
| 6,020,792 A | | 2/2000 | Nolan et al. |
| 6,509,802 B2 | * | 1/2003 | Kasperkovitz .................. 331/25 |
| 7,576,615 B2 | * | 8/2009 | Biedka ............................. 331/16 |
| 7,821,344 B2 | * | 10/2010 | Kitayama et al. ............... 331/16 |
| 8,054,137 B2 | * | 11/2011 | Osman ............................ 331/17 |
| 8,055,932 B2 | | 11/2011 | Prihadi et al. |
| 8,188,798 B1 | * | 5/2012 | Leung ....................... H03L 7/08 331/111 |
| 8,432,197 B2 | * | 4/2013 | Daly et al. ..................... 327/156 |
| 8,497,741 B2 | * | 7/2013 | Pedersen et al. ............... 331/176 |
| 8,508,269 B2 | * | 8/2013 | Tokunaga ............... H03K 4/501 327/148 |
| 8,878,614 B2 | * | 11/2014 | Yin et al. ......................... 331/25 |
| 8,981,862 B2 | * | 3/2015 | Liu et al. ....................... 331/186 |
| 2006/0097793 A1 | * | 5/2006 | Chiang ........................... 331/16 |
| 2012/0146828 A1 | * | 6/2012 | Narathong et al. ........... 341/154 |
| 2014/0218124 A1 | * | 8/2014 | Tang et al. ................. 331/36 C |
| 2015/0123743 A1 | * | 5/2015 | Kiyohara ................... 331/36 C |

OTHER PUBLICATIONS

Flynn, M. et al., "A 1.2-ξm CMOS Current-Controlled Oscillator", IEEE Journal of Solid-State Circuits, vol. 27, No. 7, Jul. 1992, pp. 982-987.

DeSmedt, V. et al., "A 0.6V to 1.6V, 46 µW Voltage and Temperature Independent 48 MHz Pulsed LC Oscillator for RFID Tags", 2011 IEEE Asian Solid State Circuits Conference, Nov. 14-16, 2011, pp. 109-112.

* cited by examiner

Primary Examiner — Thomas J Hiltunen

(57) ABSTRACT

A tunable clock circuit has a dual overlapping digital to analog converter (DAC) and an oscillator. The dual overlapping DAC provides a first output selectable with a first resolution and a second output selectable with a second resolution. The first resolution is different from the second resolution. The oscillator has a first input coupled to the first output of the dual overlapping DAC, a second input coupled to the second output of the dual overlapping DAC, and an output providing a clock output signal.

19 Claims, 4 Drawing Sheets

TEMPERATURE-COMPENSATED HIGH ACCURACY CLOCK

BACKGROUND

1. Field of the Disclosure

The present disclosure relates in general to a clock, and more specifically to a temperature-compensated high accuracy internal clock.

2. Description of the Related Art

In computer processing systems, internal clocks can be used to eliminate the need for expensive crystals, but require tighter temperature drift and resolution to communicate with external peripherals or devices. Another requirement for internal clocks is the ability to tune to another more accurate source or "clock recover" to communicate with external peripherals. Other considerations for external communication include cycle to cycle jitter and time interval error.

Requirements vary depending upon how the clock is used, but usually there are incremental requirements that need to be met for each use. For example, for a full speed Universal Serial Bus (USB) peripheral device, a clock that is within 2500 parts per million (ppm) of an integer multiple of 12 or 48 Mhz is adequate. Alternatively, a clock that is within 15000 ppm (1.5%) and can be quickly tuned to the incoming USB data stream to 2500 ppm is considered adequate.

Thus, it is desirable to provide processing systems with clocks that generate signals well within frequency accuracy specifications.

BRIEF DESCRIPTION OF THE DRAWINGS

The benefits, features, and advantages of the present disclosure will become better understood with regard to the following description, and accompanying drawings where.

DETAILED DESCRIPTION

Embodiments of systems and methods disclosed herein provide a clock that can be used internally in components in a processing system while eliminating the need for a crystal that requires space and adds significant cost. The clock uses a single voltage divider coupled to dual overlapping programmable digital to analog converters (DACs), a current amplifier, a programmable temperature compensation resistor DAC coupled to the current amplifier. The dual DACs being coupled to the same voltage divider allows coarse and fine tuning resolution of the clock frequency that is independent of variations in supply voltage and temperature. Temperature variation is minimized with a temperature compensation resistor DAC that includes two different types of resistors.

Figure 1:
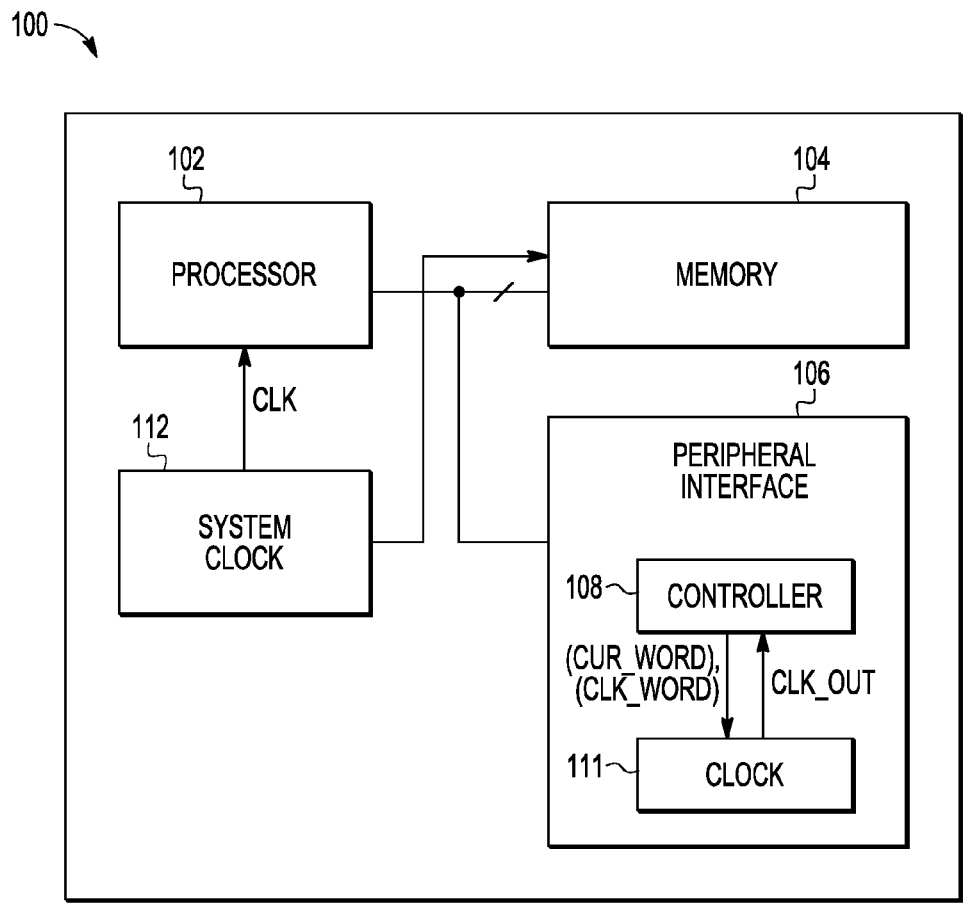
FIG. 1 is a block diagram of a processing system according to one embodiment.

FIG. 1 is a block diagram of a processing system 100 according to one embodiment that may be implemented as a System On Chip (SOC) or the like which includes at least one processor 102 coupled to a memory device 104, one or more peripheral interface circuits 106 and system clock 112 via an appropriate interface such as a bus or the like with multiple signals or bits. System 100 may include other circuits, modules or devices, such as other memory devices, other functional modules, and external interfaces, such as input, output or input/output (I/O) ports or pins or the like (not shown). In one alternative embodiment, the system 100 is implemented alone in an integrated circuit without any other devices. In another alternative embodiment, system 100 is part of a larger system on an integrated circuit.

Processor 102 can be a microprocessor, an embedded processor, a microcontroller, or other suitable type of processor. Memory 104 can included one or more different types of memory such as dynamic random access memory (DRAM), static RAM (SRAM), flash, and other suitable types of memory. System clock 112 can provide a clock signal (CLK) to processor 102 and memory 104. If system clock 112 cannot meet the clock signal requirements of one or more peripheral interfaces 106, peripheral interfaces 106 can include their own internal clock 110. Further, another internal clock 110 external to peripheral interface 106 can be used to provide a clock signal to other components such as processor 102 or memory 104, instead of or in addition to system clock 112. In other implementations, one or more clocks 110 may be external to one or more peripheral interfaces 106.

As shown, peripheral interface 106 includes a controller 108 and a clock 110. Controller 108 controls communication between processor 102 and memory 104 and a device connected (either wirelessly or hardwire) to system 100. Controller 108 provides a clock word signal (CLK_WORD) and a current word signal (CUR_WORD) to clock 110 to select respective taps on a voltage divider (not shown) to tune the frequency of clock 110. The output clock signal of clock 110 is provided to controller 108 so controller 108 can determine whether any adjustment is required to the clock and current word signals.

Peripheral interface 106 can be used to communicate with external devices, such as a universal serial bus (USB) device. Systems that communicate with various peripheral devices must typically adhere to a performance specification for each type of device. For example, the specifications for peripheral USB devices require a clock signal that is within 2500 parts per million (ppm) of 12 MHz, or is within 15000 ppm (1.5%) and can be quickly tuned to the incoming USB data stream to 2500 ppm. In some instances, clock 110 may be required to be more accurate over temperature and supply voltage variations than is possible with system clock 112. Therefore, it is desirable to provide clock 110 that meets the specifications of the particular peripheral device 106 while minimizing any space and cost penalty associated with adding another component to system 100.

Figure 2:
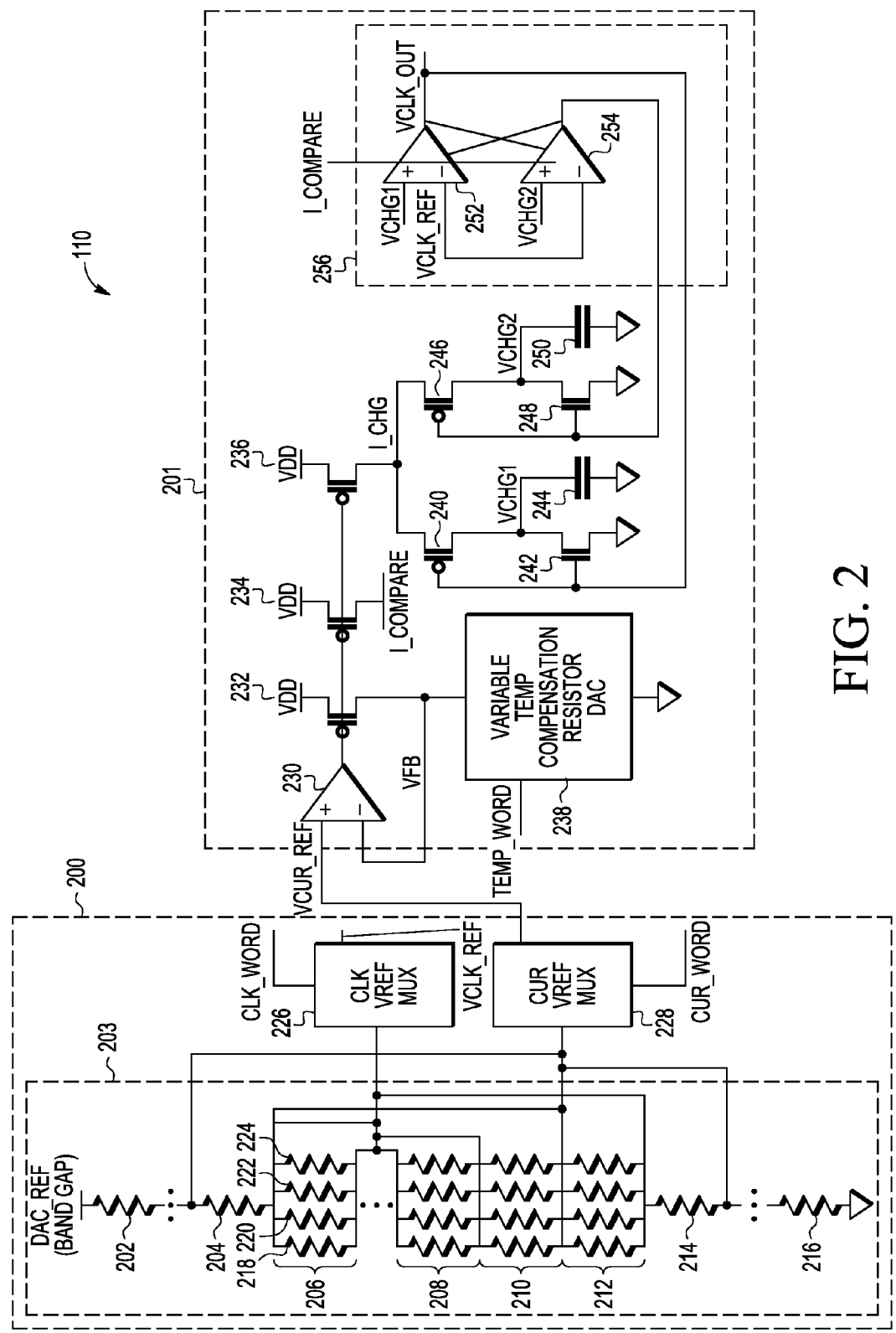
FIG. 2 is a schematic diagram of an embodiment of a clock that can be used in the processing system of FIG. 1.

FIG. 2 is a schematic diagram of an embodiment of a tunable clock circuit 110 that can be used in the processing system 100 of FIG. 1. Clock circuit 110 includes a dual overlapping digital to analog converter (DAC) 200 coupled to a relaxation oscillator 201. In the embodiment shown, voltage divider 203 is a resistor ladder that includes a series of resistor values 202-216, with a first set of the resistor values 202, 204, 214, 216 being set by a single resistor, and a second set of the resistor values 206, 208, 210, 212 each being set by four resistors 218-224 coupled in parallel to one another. The resistors values of the second set of the resistor values 206, 208, 210, 212 is typically lower than the resistors values of the first set of the resistor values 202, 204, 214, 216 to allow a more granular or finer level of adjustment to a clock reference voltage (VCLK_REF) provided to a comparator 256 in the oscillator 201. Although resistor values 206-212 are shown with four resistors, a different number of resistors can be used for resistor values 206-212.

Clock 110 has a frequency that is nearly independent of variations in supply voltage and temperature after trim. Voltage divider 203 allows the amount of error in the clock 110 to be tuned to an external frequency within +–300 ppm of an external system clock 112 (FIG. 1). The configuration of voltage divider 203 can be further tuned to meet tighter resolution if desired. For example, temperature and voltage sensitivity can be tuned to within 0.25% to 0.5%, using two temperature points, for trim over a full temperature range, or better over more limited temperature ranges.

DAC 200 includes analog multiplexers 226, 228. Multiplexer 226 is shown as a clock reference voltage multiplexer coupled to receive voltage tapped at each of the resistor values 206, 208, 210, 212. A clock word control signal (CLK_WORD) is provided from a controller 108 (FIG. 1) to multiplexer 226 to select which voltage from voltage divider 203 to provide as a clock reference voltage (VCLK_REF). The VCLK_REF is used as input to the oscillator 201.

Multiplexer 228 is shown as a current reference voltage multiplexer coupled to receive voltage tapped at each of the resistor values 202, 204, 214, 216. A current word control signal (CUR_WORD) is provided from controller 108 (FIG. 1) to multiplexer 228 to select which voltage from voltage divider 203 to provide as a current reference voltage (VCUR_REF). The VCUR_REF is also used as input to the oscillator 201.

Oscillator 201 includes a high gain differential amplifier 230, P-channel transistors 232, 234, 236, a variable temperature compensation resistor digital to analog converter (DAC) 238, a first inverter including P-channel transistor 240 coupled to N-channel transistor 242, a first capacitor 244 coupled between the output of the first inverter (between transistors 240, 242) and ground, a second inverter including P-channel transistor 246 coupled to N-channel transistor 248, a second capacitor 250 coupled between the output of the second inverter (transistors 246, 248) and ground, and a double differential latching comparator 256.

Amplifier 230 has a positive input coupled to the current reference voltage VCUR_REF and a negative input coupled to feedback voltage (VFB) from the drain electrode of P-channel transistor 232. The value of feedback voltage VFB will be the same as reference voltage VCUR_REF. Amplifier 230 with P-channel transistor 232 are configured to have unity gain and the output of amplifier 230 is coupled to gate electrodes of P-channel transistors 232, 234 and 236, which act as current sources that are proportional to voltage VCUR_REF. The source electrodes of transistors 232, 234, 236 are coupled to a supply voltage such as VDD. The drain electrode of transistor 232 is coupled to the variable DAC 238, which is set at a temperature-compensated resistance that is determined when clock 110 is manufactured. Alternatively, capacitors 244, 250 and/or the resistor DAC 238 could be programmable for added ranges of frequency.

The drain electrode of transistor 234 is coupled to a compare current source (I_COMPARE) which provides a bias current to the comparators 252 and 254.

Clock reference voltage (VCLK_REF) and current reference voltage (VCUR_REF) are proportional so any voltage variation in reference voltage DAC_VREF cancel one another such that the output frequency of VCLK_OUT does not change.

The drain electrode of transistor 236 is coupled to the source electrodes of P-channel transistors 240 and 246, which is labeled as net I_CHG in FIG. 2. The drain electrode of P-channel transistor 240 is coupled to the drain electrode of N-channel transistor 242. The source electrode of N-channel transistor 242 is coupled to ground. Capacitor 244 has a first terminal coupled to the output of the first inverter (labeled VCHG1) between the drain electrode of P-channel transistor 240 and the drain electrode of N-channel transistor 242, and a second terminal coupled to ground. The gate electrode of P-channel transistor 240 and the gate electrode of N-channel transistor 242 are coupled to the clock output signal (VCLK_OUT) of comparator 252, which is part of double differential latching comparator 256.

The drain electrode of P-channel transistor 246 is coupled to the drain electrode of N-channel transistor 248. The source electrode of N-channel transistor 248 is coupled to ground. Capacitor 250 has a first terminal coupled to the output of the second inverter (labeled VCHG2) between the drain electrode of P-channel transistor 246 and the drain electrode of N-channel transistor 248, and a second terminal coupled to ground. The gate electrode of P-channel transistor 246 and the gate electrode of N-channel transistor 248 are coupled to the clock output signal (VCLK_OUT) of comparator 254, which is part of differential comparator 256.

Double differential latching comparator 256 includes first comparator 252 and second comparator 254. A positive input to comparator 252 is coupled to the output (VCHG1) of the first inverter and a negative input to comparator 252 is coupled to the output of the clock reference voltage multiplexer 226 (VCLK_REF). A positive input to comparator 254 is coupled to the output (VCHG2) of the second inverter and a negative input to comparator 254 is coupled to the output of the clock reference voltage multiplexer 226 (VCLK_REF). Double differential latching comparator 256 allows high-speed operation with good control linearity. Other suitable comparator(s) can be used instead of comparator 256, however.

Figure 3:
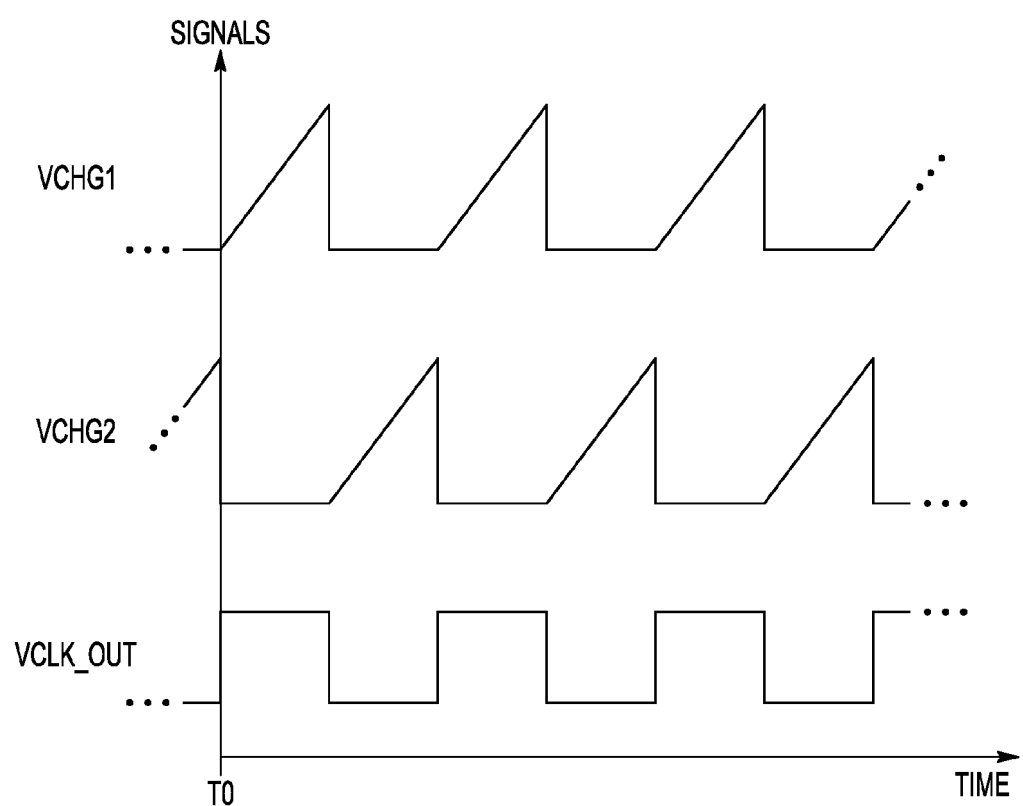
FIG. 3 is a timing diagram showing states of selected signals during operation of the clock of FIG. 2 in accordance with one embodiment.

FIG. 3 is a timing diagram showing states of VCHG1 and VCHG2 signals during operation of the clock of FIG. 2 in accordance with one embodiment. Initially, at time T0, the output of comparator 252 is low and the output of comparator 254 is high. The PMOS transistor 240 is ON, connecting capacitor 244 to charging current source I_CHG. Capacitor 250 is discharged directly to ground via the NMOS transistor 248. Capacitor 244 continues to charge until VCHG1 exceeds VCLK_REF. When this happens the output of comparator 252 goes high setting the latch, reversing the states of the outputs of comparators 252 and 254 to high and low, respectively. Now capacitor 250 is connected to its charging current source I_CHG, and capacitor 244 is discharged rapidly to ground. Capacitor 250 continues to charge until voltage VCHG2 exceeds VCLK_REF, at which point the latch again changes state and the entire cycle repeats. Neglecting switching delay, the control current is related to the frequency (f) of the output of comparator 256 by $$I\_CHG = f * C * VCLK\_REF,$$

where C is the value of capacitor 244 and 250.

Figure 4:
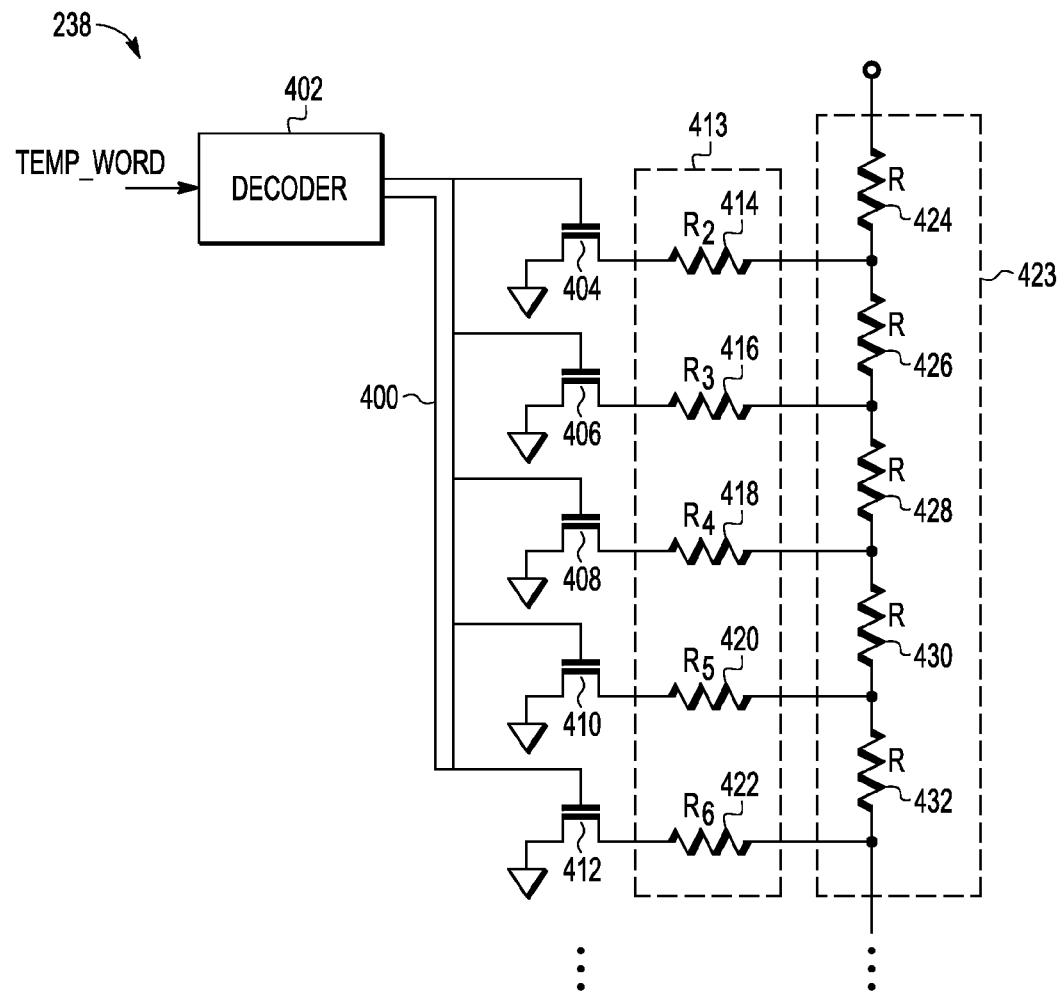
FIG. 4 is a schematic diagram of an embodiment of a selectable temperature compensation resistor DAC that can be used in the clock of FIG. 2.

FIG. 4 is a schematic diagram of an embodiment of a selectable temperature compensation resistor DAC 238 that can be used in the clock 110 of FIG. 2. As shown, DAC 238 includes a decoder 402, a data bus or other type of communication interface 400, N-channel transistors 404, 406, 408, 410, 412, a set 413 of a first type of resistors 414, 416, 418, 420, 422, and a set 423 of a second type of resistors 424, 426, 428, 430, 432. Bus 400 is configured to provide a link between decoder 402 and gate electrodes of each of N-channel transistors 404-412. A source electrode of each N-channel transistor 404-412 is coupled to ground. A drain electrode of each N-channel transistor 404-412 is coupled in series to a first terminal of a respective one of first type of resistors 414-422. Resistors 424-432 of the second type are coupled in series with one another. First type of resistor 414 has a second terminal coupled to the connection between second type of resistors 424 and 426.

First type of resistor 416 has a second terminal coupled to the connection between second type of resistors 426 and 428. First type of resistor 418 has a second terminal coupled to the connection between second type of resistors 428 and 430. First type of resistor 420 has a second terminal coupled to the connection between second type of resistors 430 and 432.

A control signal TEMP_WORD can be provided to decoder 402 from controller 108 or hardwired during manufacturing when temperature compensation tests are run. Decoder 402 decodes the control signal TEMP_WORD and provides a gate control signal to place one or more of the N-channel transistors 404-412 in conducting mode, depending on the level of temperature compensation required. Resistors 414-422 have different values of resistance from one another and from resistors 424-432 while resistors 424-432 have the same value as one another. The values of resistors 414-422 and 424-432 are selected such that the following relations are met (where the letter "R" denotes the word "resistor"):

$$(R424+R414)=(2*R426+R416)=(3*R428+R418)=(4*R430+R420)=(5*R432+R422)$$

When temperature variation of clock 110 is tested at various combinations of resistance in DAC 238, the slopes of the resulting frequency drift versus temperature graphs at each resistance combination typically vary from approximately zero to a positive or negative non-zero number. It is desirable to choose a resistance level for DAC 238 that results in little or no frequency drift over the expected range of operating temperatures, i.e., a resistance level that results in a frequency drift versus temperature curve with as little slope as possible.

The use of at least two different types of resistors for resistors 414-422 and 424-432, with one resistor type having a negative temperature coefficient and the other having a positive temperature coefficient, provides the ability to compensate the clock frequency and achieve little or no frequency drift over temperature.

Note that although DAC 238 is shown with resistors 414-422 and corresponding resistors 424-432, DAC 238 can include additional (or fewer) resistors of both types to provide a different number of temperature compensation levels. Additionally, more than two different types of resistors can be used in DAC 238.

By now it should be appreciated that in some embodiments, a tunable clock circuit (110) can include a dual overlapping digital to analog converter (DAC) (200) providing a first output (226) selectable with a first resolution and a second output (228) selectable with a second resolution. The first resolution is different from the second resolution. An oscillator (201) can have a first input (240/246) coupled to the first output of the dual overlapping DAC, a second input (226) coupled to the second output of the dual overlapping DAC, and an output providing a clock output signal (252).

In another aspect, the dual overlapping DAC can comprise a voltage divider (203) having a first plurality of taps (226) providing the first resolution and a second plurality of taps (228) providing the second resolution.

In another aspect, the dual overlapping DAC can further comprise a first multiplexer (226) having a first plurality of inputs coupled to the first plurality of taps and an output as the first output of the dual overlapping DAC providing a selected tap of the first plurality of taps to the first input of the oscillator and a second multiplexer (228) having a first plurality of inputs coupled to the second plurality of taps and an output as the second output of the dual overlapping DAC coupled to the second input of the oscillator.

In another aspect, the first multiplexer can select the selected tap of the first plurality of taps responsive to a first digital word and the second multiplexer selects the selected tap of the second plurality of taps responsive to the a second digital word.

In another aspect, the first input of the oscillator can be used in switching detection and the second input of the oscillator can be used to control current flow.

In another aspect, the first resolution can be a higher resolution than the second resolution.

In another aspect, the voltage divider can comprise a resistor ladder.

In another aspect, the first plurality of taps spans a first resistance range (206-210) of the resistor ladder and the second plurality of taps spans a second resistance range (204-214) of the resistor ladder, wherein the first resistance range is less than and within a subset of the second resistance range.

In another aspect, a portion of the first plurality of taps can be present in the second plurality of taps.

In another aspect, the resistor ladder can comprise a first plurality of resistor values, wherein a first resistor value of the first plurality of resistor values comprise a plurality of resistors (218, 220, 222, 224) in parallel.

In another aspect, the tunable clock circuit can further comprise an amplifier (230) coupled between the output of the second multiplexer and the second input of the oscillator, a current mirror (232, 234, 236) coupling an output of the of the amplifier to the second input of the oscillator; and a resistor (238) with selectable temperature compensation coupled to the current mirror.

In another aspect, the oscillator can comprise a first charging circuit (242, 244) having a first input coupled to the current mirror, a second input, and an output; a second charging circuit (248, 250) having a first input coupled to the current mirror, a second input, and an output; and a dual differential latching comparator (256) having a first input coupled to the output of the first charging circuit, a clock output that provides the clock output signal coupled to the second input of the first charging circuit; a second input coupled to the output of the second charging circuit, a secondary output coupled to the second input of the second charging circuit, and a third input coupled to the output of the first multiplexer.

In another embodiment, a tunable clock circuit (110) can comprise a resistor ladder (203) having a first plurality of taps and a second plurality of taps. The first plurality of taps can have a first resolution and the second plurality of taps can have a second resolution that is a different resolution from the first resolution. A first multiplexer (226) can have a plurality of inputs coupled to the first plurality of taps and an output. A second multiplexer (228) can have a plurality of inputs coupled to the second plurality of taps and an output. An oscillator (201) can have a first input coupled to the output of the first multiplexer, a second input coupled to output of the second multiplexer, and an output providing a clock output signal.

In another aspect, the first resolution can be a higher resolution than the second resolution, the second plurality of taps can cover a greater range of the resistor ladder than the first plurality of taps, and the first plurality of taps can be within the range of the resistor ladder covered by the second plurality of taps.

In another aspect, the output of the second multiplexer can be coupled to the second input of the oscillator through an amplifier and a current mirror (232, 234, 236), wherein the current mirror can have temperature control using a resistor with selectable temperature compensation (238).

In yet another embodiment, a method of providing a clock signal (252) can comprise selecting a first tap from a first plurality of taps of a voltage divider (203), wherein the first plurality of taps has a first resolution, selecting a second tap from a second plurality of taps of the voltage divider, wherein the second plurality of taps has a second resolution different from the first resolution, coupling the first tap to a first input of an oscillator (256) and the second tap to a second input of the oscillator 240, 246), and providing the clock signal at an output of the oscillator (256) at a frequency based on the first tap and on the second tap.

In another aspect, the selecting the second tap can be further characterized by the first resolution being a higher resolution than the second resolution.

In another aspect, the providing the clock signal at an output of the oscillator can be further characterized by the first tap controlling switch points of the oscillator and the second tap controlling current flow of the oscillator.

In another aspect, the second tap controlling the current flow can be further characterized as using a resistor with selectable temperature compensation for frequency stability over temperature of the clock signal.

In another aspect, the selecting the first tap can be further characterized by the voltage divider comprising a resistor ladder in which the first plurality of taps is within a first range of the resistor ladder; and the selecting the second tap can be further characterized by the second plurality of taps being within a second range of the resistor ladder, wherein the first range is less than and within the second range.

This disclosure is presented to enable one of ordinary skill in the art to make and use the present disclosure as provided within the context of a particular application and its requirements. Various modifications to the preferred embodiments will, however, be apparent to one skilled in the art, and the general principles defined herein may be applied to other embodiments. Therefore, the present disclosure is not intended to be limited to the particular embodiments shown and described herein, but is to be accorded the widest scope consistent with the principles and novel features herein disclosed.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of systems disclosed herein are circuitry located on a single integrated circuit or within a same device. Alternatively, the systems may include any number of separate integrated circuits or separate devices interconnected with each other. Also for example, a system or portions thereof may be soft or code representations of physical circuitry or of logical representations convertible into physical circuitry. As such, a system may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the present disclosure has been described in considerable detail with reference to certain preferred versions thereof, other versions and variations are possible and contemplated. For example, a capacitor-based trim feature can be added to increase frequency range at the output of the clock. Those skilled in the art should appreciate that they can readily use the disclosed conception and specific embodiments as a basis for designing or modifying other structures for carrying out the same purposes of the present disclosure without departing from the scope of the disclosure as defined by the appended claims.

What is claimed is:

1. A tunable clock circuit, comprising:
a dual overlapping digital to analog converter (DAC) providing a first output selectable with a first resolution and a second output selectable with a second resolution, wherein the first resolution is different from the second resolution;
an oscillator having a first input coupled to the first output of the dual overlapping DAC, a second input coupled to the second output of the dual overlapping DAC, and an output providing a clock output signal, wherein the dual overlapping DAC comprises a voltage divider having a first plurality of taps providing the first resolution and a second plurality of taps providing the second resolution.

2. The tunable clock circuit of claim 1, wherein the dual overlapping DAC further comprises a first multiplexer having a first plurality of inputs coupled to the first plurality of taps and an output as the first output of the dual overlapping DAC providing a selected tap of the first plurality of taps to the first input of the oscillator and a second multiplexer having a first plurality of inputs coupled to the second plurality of taps and an output as the second output of the dual overlapping DAC coupled to the second input of the oscillator.

3. The tunable clock circuit of claim 2, wherein the first multiplexer selects the selected tap of the first plurality of taps responsive to a first digital word and the second multiplexer selects the selected tap of the second plurality of taps responsive to the a second digital word.

4. The tunable clock circuit of claim 3, wherein the first input of the oscillator is used in switching detection and the second input of the oscillator is used to control current flow.

5. The tunable clock circuit of claim 4, wherein the first resolution is a higher resolution than the second resolution.

6. The tunable clock circuit of claim 5, wherein the voltage divider comprises a resistor ladder.

7. The tunable clock circuit of claim 6, wherein the first plurality of taps spans a first resistance range of the resistor ladder and the second plurality of taps spans a second resistance range of the resistor ladder, wherein the first resistance range is less than and within a subset of the second resistance range.

8. The tunable clock circuit of claim 7, wherein a third plurality of taps is present in both the first plurality of taps and the second plurality of taps.

9. The tunable clock circuit of claim 6, wherein the resistor comprises a first plurality of values, wherein a first resistor value of the first plurality of values comprise a plurality of resistors in parallel.

10. The tunable clock circuit of claim 2, further comprising:
 a current mirror coupling the output of the of the second multiplexer to the second input of the oscillator; and
 a resistor with selectable temperature compensation coupled to the current mirror.

11. The tunable clock circuit of claim 10, wherein the oscillator comprises:
 a first charging circuit having a first input coupled to the current mirror, a second input, and an output;
 a second charging circuit having a first input coupled to the current mirror, a second input, and an output; and
 a dual differential latching comparator having a first input coupled to the output of the first charging circuit, a clock output that provides the clock output signal coupled to the second input of the first charging circuit; a second input coupled to the output of the second charging circuit, a secondary output coupled to the second input of the second charging circuit, and a third input coupled to the output of the first multiplexer.

12. A tunable clock circuit, comprising:
 a resistor ladder having a first plurality of taps and a second plurality of taps, wherein the first plurality of taps has a first resolution and the second plurality of taps has a second resolution that is a different resolution from the first resolution;
 a first multiplexer having an input coupled to a selected tap of the first plurality of taps and an output;
 a second multiplexer having an input coupled to a selected tap of the second plurality of taps and an output; and
 an oscillator having a first input coupled to the output of the first multiplexer, a second input coupled to output of the second multiplexer, and an output providing a clock output signal.

13. The tunable clock circuit of claim 12, wherein the first resolution is a higher resolution than the second resolution, the second plurality of taps covers a greater range of the resistor ladder than the first plurality of taps, and the first plurality of taps is within the range of the resistor ladder covered by the second plurality of taps.

14. The tunable circuit of claim 11, wherein the output of the second multiplexer is coupled to the second input of the oscillator through a current mirror that has temperature control using a resistor with selectable temperature compensation.

15. A method of providing a clock signal, comprising:
 selecting a first tap from a first plurality of taps of a voltage divider, wherein the first plurality of taps has a first resolution;
 selecting a second tap from a second plurality of taps of the voltage divider, wherein the second plurality of taps has a second resolution different from the first resolution;
 coupling the first tap to a first input of an oscillator and the second tap to a second input of the oscillator; and
 providing the clock signal at an output of the oscillator at a frequency based on the first tap and on the second tap.

16. The method of claim 15, wherein the selecting the second tap is further characterized by the first resolution being a higher resolution than the second resolution.

17. The method of claim 16 wherein the providing the clock signal at an output of the oscillator is further characterized by the first tap controlling switch points of the oscillator and the second tap controlling current flow of the oscillator.

18. The method of claim 17, wherein the second tap controlling the current flow is further characterized as using a resistor with selectable temperature compensation for frequency stability over temperature of the clock signal.

19. The method of claim 16, wherein:
 the selecting the first tap is further characterized by the voltage divider comprising a resistor ladder in which the first plurality of taps is within a first range of the resistor ladder; and
 the selecting the second tap is further characterized by the second plurality of taps being with a second range of the resistor ladder, wherein the first range is less than and within the second range.

* * * * *